United States Patent
Kumar et al.

(10) Patent No.: US 6,518,193 B1
(45) Date of Patent: Feb. 11, 2003

(54) SUBSTRATE PROCESSING SYSTEM

(75) Inventors: Kiran Kumar, Sunnyvale, CA (US); Zhihai Wang, Sunnyvale, CA (US); Rudy Rios, San Jose, CA (US); Wilbur G. Catabay, Saratoga, CA (US); Richard D. Schinella, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/802,424

(22) Filed: Mar. 9, 2001

(51) Int. Cl.$^7$ ............... H01L 21/302; H01L 21/461

(52) U.S. Cl. ............... 438/715; 438/715; 438/716; 438/758

(58) Field of Search ............... 438/715, 716, 438/758

(56) References Cited

U.S. PATENT DOCUMENTS

| | | | | |
|---|---|---|---|---|
| 4,951,601 A | * | 8/1990 | Maydan et al. | 118/719 |
| 5,730,801 A | * | 3/1998 | Tepman et al. | 118/719 |
| 5,981,399 A | * | 11/1999 | Kawamura et al. | 438/175 |
| 6,308,932 B1 | * | 10/2001 | Ettinger et al. | 251/167 |

FOREIGN PATENT DOCUMENTS

JP          62-147726   * 1/1987 ........... H01L/21/30

* cited by examiner

Primary Examiner—Long Pham
Assistant Examiner—Khiem Nguyen
(74) Attorney, Agent, or Firm—Luedeka, Neely & Graham, P.C.

(57) ABSTRACT

An apparatus for performing contaminant sensitive processing on a substrate. A substrate load chamber receives the substrate from an ambient contaminant laden environment, and isolates the substrate from the ambient contaminant laden environment. The substrate load chamber further forms a first environment of intermediate cleanliness around the substrate. A substrate pass through chamber receives the substrate from the substrate load chamber, and isolates the substrate from the intermediate cleanliness of the first environment of the substrate load chamber. The substrate pass through chamber further forms a second environment of high cleanliness around the substrate. A substrate transfer chamber receives the substrate from the substrate pass through chamber, and isolates the substrate from the high cleanliness of the second environment of the substrate pass through chamber. The substrate transfer chamber maintains a third environment of high cleanliness around the substrate, and transfers the substrate into more than one substrate processing chambers, where the substrate is selectively transferred into and out of the more than one substrate processing chambers without leaving the high cleanliness of the third environment. The substrate transfer chamber also selectively passes the substrate to the substrate pass through chamber when the substrate pass through chamber has formed the high cleanliness of the second environment. The substrate pass through chamber also receives the substrate from the substrate transfer chamber, and selectively passes the substrate to the substrate load chamber when the substrate load chamber has formed the intermediate cleanliness of the first environment. The substrate load chamber receives the substrate from the substrate pass through chamber, and selectively passes the substrate out of the substrate load chamber and into the ambient contaminant laden environment when the substrate load chamber is not open to the substrate pass through chamber.

6 Claims, 2 Drawing Sheets

SUBSTRATE PROCESSING SYSTEM

FIELD

This invention relates to the field of integrated circuit fabrication. More particularly this invention relates to a system for performing contaminant sensitive processing on a substrate.

BACKGROUND

A variety of different materials are typically used in integrated circuit fabrication processes. Many of these materials are highly susceptible to various contaminants. In addition, some processes, at intermediate points, create sites or structures that are very susceptible to contamination. For example, when trenches or holes are etched into dielectric films, the dielectric films tend to be extremely susceptible to contaminants in the atmosphere such as oxygen, nitrogen, rare gases, hydrocarbons, water vapor and other atmospheric contaminants. When exposed to such, the etched portions of the dielectric layer tend to attract such contaminants.

In the specific case of low dielectric constant materials, which tend to be porous in nature, the adsorption of contaminants tends to be even greater. Thus, when a low dielectric constant material is etched, the etched portions tend to adsorb contaminants. Then, when a thin material layer is subsequently deposited over the etched portions, such as when a diffusion barrier is formed in a via, the contaminants absorbed in the low dielectric constant material in the area of the etched via tend to outgas and interfere with the uniform and desirable deposition of the deposited layer. This condition tends to cause problems with the integrated circuit, such as barrier layers that are porous or otherwise defection, and which do not exhibit the desired barrier properties.

As a more specific example, when a titanium adhesion layer is deposited in an etched silicon oxide via, and then the titanium adhesion layer is followed by a titanium nitride diffusion barrier layer, and then the titanium nitride diffusion barrier layer is followed by a tungsten plug deposition, the resultant structure often exhibits a breakdown of the barrier diffusion layer, which is typically referred to as poisoned vias or poisoned plugs.

What is needed, therefore, is a system for forming structures on a substrate, where the substrate and the various layers are not exposed to a contaminant laden environment.

SUMMARY

The above and other needs are met by an apparatus for performing contaminant sensitive processing on a substrate. A substrate load chamber receives the substrate from an ambient contaminant laden environment, and isolates the substrate from the ambient contaminant laden environment. The substrate load chamber further forms a first environment of intermediate cleanliness around the substrate.

A substrate pass through chamber receives the substrate from the substrate load chamber, and isolates the substrate from the intermediate cleanliness of the first environment of the substrate load chamber. The substrate pass through chamber further forms a second environment of high cleanliness around the substrate.

A substrate transfer chamber receives the substrate from the substrate pass through chamber, and isolates the substrate from the high cleanliness of the second environment of the substrate pass through chamber. The substrate transfer chamber maintains a third environment of high cleanliness around the substrate, and transfers the substrate into more than one substrate processing chambers, where the substrate is selectively transferred into and out of the more than one substrate processing chambers without leaving the high cleanliness of the third environment.

The substrate transfer chamber also selectively passes the substrate to the substrate pass through chamber when the substrate pass through chamber has formed the high cleanliness of the second environment. The substrate pass through chamber also receives the substrate from the substrate transfer chamber, and selectively passes the substrate to the substrate load chamber when the substrate load chamber has formed the intermediate cleanliness of the first environment. The substrate load chamber receives the substrate from the substrate pass through chamber, and selectively passes the substrate out of the substrate load chamber and into the ambient contaminant laden environment when the substrate load chamber is not open to the substrate pass through chamber.

Because there is a substrate pass through chamber between the substrate load chamber and the substrate transfer chamber, the high cleanliness environment of the substrate transfer chamber is never exposed to the intermediate cleanliness of the substrate load chamber, or the contaminant laden ambient environment. Thus, the substrate pass through chamber, by forming an environment of high cleanliness before transferring a substrate to or accepting a substrate from the substrate transfer chamber, protects and helps maintain the high cleanliness of the environment of the substrate transfer chamber. Therefore, those contaminant sensitive processes that are performed in the various substrate processing chambers are not exposed to the environment of intermediate cleanliness or to the contaminant laden ambient environment, and the intermediate structures which may be created by these various processes are likewise not exposed to the environments of lesser cleanliness.

In another aspect of the invention, a method of performing contaminant sensitive processing on a substrate is given. The substrate is transferred from an ambient contaminant laden environment and into a substrate load chamber. The substrate is isolated from the ambient contaminant laden environment with the substrate load chamber, and the substrate load chamber forms a first environment of intermediate cleanliness around the substrate.

The substrate is transferred from the intermediate cleanliness of the first environment of the substrate load chamber and into a substrate pass through chamber, where the substrate is isolated from the intermediate cleanliness of the first environment of the substrate load chamber. A second environment of high cleanliness is formed around the substrate with the substrate pass through chamber.

The substrate is transferred from the high cleanliness of the second environment of the substrate pass through chamber and into a substrate transfer chamber, where a third environment of high cleanliness is maintained around the substrate. The substrate is selectively transferred into more than one substrate processing chambers, where the substrate is selectively transferred into and out of the more than one substrate processing chambers without leaving the high cleanliness of the third environment. The substrate is selectively processed in the more than one substrate processing chambers.

The substrate is transferred to the substrate pass through chamber from the substrate transfer chamber when the substrate pass through chamber has formed the high cleanliness of the second environment and the substrate pass through chamber is not open to the substrate load chamber. The substrate is transferred to the substrate load chamber from the substrate pass through chamber when the substrate load chamber has formed the intermediate cleanliness of the first environment and the substrate pass through chamber is not open to the substrate transfer chamber. The substrate is transferred out of the substrate load chamber and into the ambient contaminant laden environment when the substrate load chamber is not open to the substrate pass through chamber.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
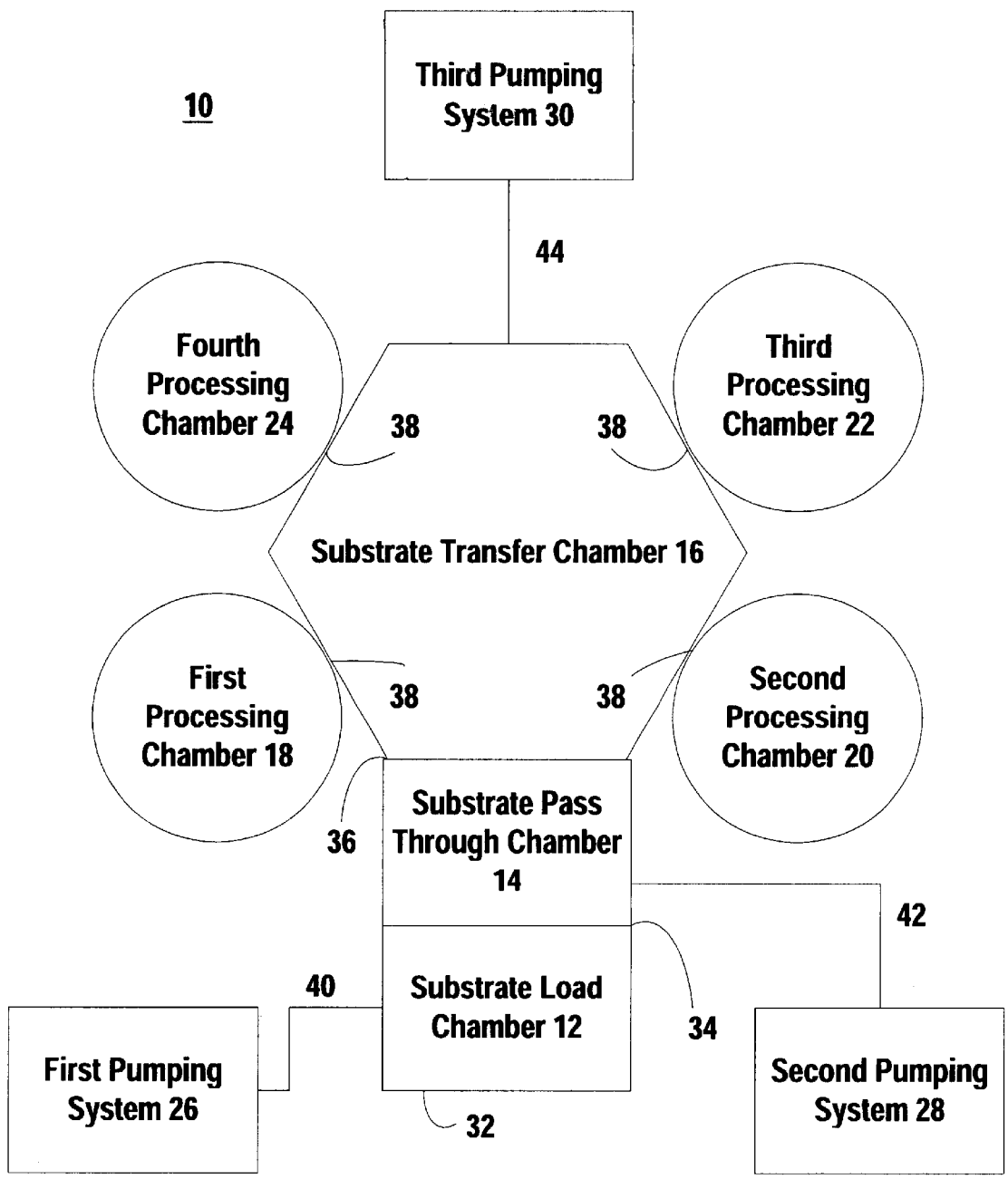
FIG. 1 is a functional block diagram of an apparatus according to the present invention.

Referring now to FIG. 1, there is depicted an apparatus 10 according to the present invention. Substrates are transferred into and out of the apparatus 10 via a substrate load chamber 12, which can be selectively isolated from the contaminant laden ambient environment around the apparatus 10 via a load lock mechanism 32. By contaminant laden environment, it is not necessarily meant that the ambient environment is filthy. Rather, it is intended to mean that the ambient environment contains some sort of material that is detrimental to a material, process, or structure that is to be deposited, used, or exposed at a point in time during the desired processing of the substrate. Thus, even oxygen or water, such as water vapor, may be considered a contaminant within the present context. It is anticipated that the load lock 32 of the substrate load chamber 12 will open up into a clean room facility.

Once the substrate is brought within the substrate load chamber 12, the load lock 32 is closed, isolating the substrate from the contaminant laden ambient environment. An environment of intermediate cleanliness is preferably formed around the substrate once it is within the substrate load chamber 12. This is preferably accomplished by drawing a vacuum within the substrate load chamber 12, such as by using a first pumping system 26 that is in communication with the substrate load chamber 12 via a vacuum line 40. In the most preferred embodiment, the first pumping system 26 is a roughing pump, such as a rotary vane pump, which reduces the pressure within the substrate load chamber 12 to at least about $10^{-3}$ torr.

By reducing the pressure within the substrate load chamber 12 in this manner, a first environment of intermediate cleanliness if formed. The first environment has an intermediate cleanliness because much of the matter of the contaminant laden ambient environment has been removed by drawing a vacuum on the first environment. Thus, much of what is detrimental to the later processes, materials, and structures has been removed from the first environment. Further, the first environment is not as clean as is ultimately desired, and thus the first environment is designated as having an intermediate cleanliness that is somewhere between the contaminant laden ambient environment and the cleaner environment that is ultimately desired.

The substrate is brought into a substrate pass through chamber 14, such as by opening a load lock 34 between the substrate load chamber 12 and the substrate pass through chamber 14. In the preferred embodiment, the load lock 34 between the substrate pass through chamber 14 and the substrate load chamber 12 is not opened unless the load lock 32 is closed and the first environment of intermediate cleanliness has been formed in the substrate load chamber 12. In this manner, the substrate pass through chamber 14 is kept isolated from the contaminant laden ambient environment.

Once the substrate is brought within the substrate pass through chamber 14, the load lock 34 is closed, isolating the substrate from the intermediate cleanliness of the first environment of the substrate load chamber 12. A second environment of high cleanliness is preferably formed around the substrate once it is within the substrate pass through chamber 14. This is preferably accomplished by drawing a vacuum within the substrate pass through chamber 14, such as by using a second pumping system 28 that is in communication with the substrate pass through chamber 14 via a vacuum line 42. In the most preferred embodiment, the second pumping system 28 is a cryogenic pump, or some other high vacuum type pump such as a diffusion pump or molecular pump, which reduces the pressure within the substrate pass through chamber 14 to at least about $10^{-7}$ torr. In another embodiment, the first pumping system 26 and the second pumping system 28 are the same pumping system that is appropriately valved to the substrate pass through chamber 14 and the substrate load chamber 12.

By reducing the pressure within the substrate pass through chamber 14 in this manner, a second environment of high cleanliness if formed. The second environment has a high cleanliness because an additional amount of the matter of the intermediate cleanliness environment has been removed by drawing a higher vacuum on the second environment. Thus, even more of what is detrimental to the later processes has been removed from the second environment. The second environment may still not be as clean as is ultimately desired, for a variety of reasons. For example, because the substrate pass through chamber 14 is intermittently exposed to the intermediate cleanliness of the first environment, it may not be able to become as clean as an environment that is not intermittently exposed to the intermediate cleanliness of the first environment, but which is rather more isolated from sources of contaminants.

The substrate is brought into a substrate transfer chamber 16, such as by opening a load lock 36 between the substrate pass through chamber 14 and the substrate transfer chamber 16. In the preferred embodiment, the load lock 36 between the substrate pass through chamber 14 and the substrate transfer chamber 16 is not opened unless the load lock 34 between the substrate pass through chamber 14 and the substrate load chamber 12 is closed and the second environment of high cleanliness has been formed in the substrate pass through chamber 14. In this manner, the substrate transfer chamber 16 is kept isolated from the intermediate cleanliness of the first environment in the substrate load chamber 12.

Once the substrate is brought within the substrate transfer chamber 16, the load lock 36 is closed, isolating the substrate from the high cleanliness environment of the substrate pass through chamber 14. An environment of high cleanliness is preferably maintained around the substrate once it is within the substrate transfer chamber 16. This is preferably accomplished by drawing a vacuum within the substrate transfer chamber 16, such as by using a third pumping system 30 that is in communication with the substrate transfer chamber 16 via a vacuum line 44. In the most preferred embodiment, the third pumping system 30 is a cryogenic pump, or some other high vacuum type pump such as a diffusion pump or molecular pump, which reduces the pressure within the substrate transfer chamber 16 to about $10^{-8}$ torr. Thus, the environment of high cleanliness within the substrate transfer chamber 16 is preferably even cleaner than that formed within the substrate pass through chamber 14.

In one embodiment, the first pumping system 26, the second pumping system 28, and the third pumping system 30 are all the same pumping system, which is appropriately valved to the substrate transfer chamber 16, the substrate pass through chamber 14, and the substrate load chamber 12.

With the substrate inside of the substrate transfer chamber 16, the substrate may now be selectively transferred into and out of various processing chambers, such as first processing chamber 18, second processing chamber 20, third processing chamber 22, and fourth processing chamber 24. It is appreciated that the number of processing chambers may be either greater than or less than the number depicted in FIG. 1 and described in this embodiment. Most preferably, the processing chambers are each selectively isolated from the substrate transfer chamber 16, such as by load locks 38.

With the processing chambers isolated from the contaminant laden ambient environment and the first environment of intermediate cleanliness, the processes conducted within the processing chambers, the material used within the processing chambers, and the intermediate structures formed within the processing chambers are all isolated from the contaminants within those relatively contaminated environments. Thus, processes, materials, and structures which are sensitive to the contaminants within the ambient environment or the intermediate cleanliness of the first environment may be more safely processed within the processing chambers.

Figure 2:
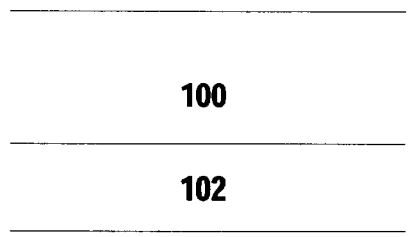
FIG. 2 is cross sectional diagram of a substrate, including a layer.
Figure 3:
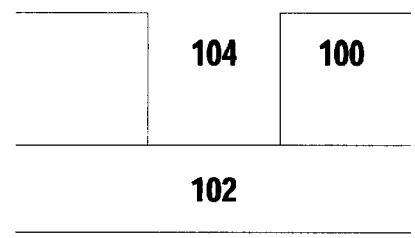
FIG. 3 is a cross sectional diagram of a via etched in the layer of the substrate.

For example, FIG. 2 depicts a substrate having a bottom layer 102 and a top layer 100. In FIG. 3, a via 104 has been etched within the top layer 100, which via 104 extends down to the bottom layer 102. In a specific example where the top layer 100 is a porous dielectric layer, such as a low dielectric constant layer, the freshly etched sidewalls of the via 104 tend to be extremely hydroscopic and readily adsorb water from an ambient environment. Thus, it is most preferred to etch vias 104 within one of the processing chambers of the apparatus 10, such as within the first processing chamber 18, so that the resultant structure, the etched via 104, is not exposed to undue levels of the water vapor contamination.

Figure 4:
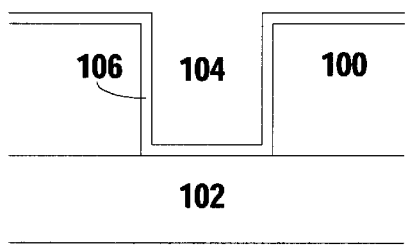
FIG. 4 is a cross sectional diagram of an adhesion layer deposited in the via of the substrate.

After the via 104 is etched, the substrate is preferably transferred to another chamber for further processing, such as to the second processing chamber 20. In the second processing chamber 20, a layer of a material may be deposited over the clean surfaces of the via 104. For example, as depicted in FIG. 4, a thin layer of an adhesion material 106, such as titanium, may be deposited in the via 104. After the adhesion layer 106 is deposited, the substrate may be removed from the apparatus 10 as described below. However, in a most preferred embodiment, the cleanliness of the environment within the substrate transfer chamber 16 is more fully utilized by processing the substrate further.

Figure 5:
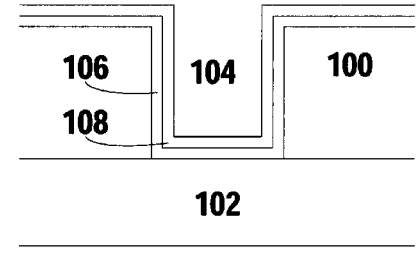
FIG. 5 is a cross sectional diagram of a barrier layer deposited in the via of the substrate.

For example, as depicted in FIG. 5, an additional layer, such as a barrier layer 108 may be deposited over the adhesion layer 106. The barrier layer 108 may be of a material such as titanium nitride, that is deposited in the third processing chamber 22. After the barrier layer 108 is deposited, the substrate may be removed from the apparatus 10 as described below. However, in a most preferred embodiment, the cleanliness of the environment within the substrate transfer chamber 16 is more fully utilized by processing the substrate further.

Figure 6:
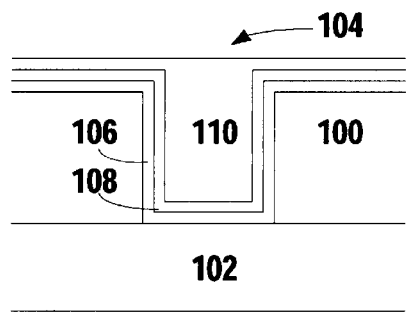
FIG. 6 is a cross sectional diagram of a plug layer deposited in the via of the substrate.

For example, as depicted in FIG. 6, and additional layer, such as a plug layer 110 maybe deposited over the barrier layer 108. The plug layer 110 may be of a material such as tantalum, that is deposited in the fourth processing chamber 24. After the plug layer 110 is deposited, the substrate is preferably removed from the apparatus 10.

In other embodiments, the via 104 is etched in the first processing chamber 18, and the etched via 104 is then cleaned in the second processing chamber 20. An adhesion layer 106 of titanium is then deposited by sputter deposition in the third processing chamber 22, and a barrier layer 108 of titanium nitride is deposited by chemical vapor deposition in the fourth processing chamber 24. Alternately, after the clean in the second processing chamber 20 is performed, a barrier layer of tantalum is sputter deposited in the third processing chamber 22, and a layer 110 of copper is sputter deposited in the fourth processing chamber 24.

It is appreciated that the number of process steps performed within the apparatus 10, the materials described in the specific examples above, and the types of process steps so described are all by way of example only. In various embodiments, different numbers and types of process steps may be performed within the apparatus 10.

The substrate is withdrawn from the apparatus 10 by transferring it from the substrate transfer chamber 16 when the second environment of high cleanliness has been formed in the substrate pass through chamber 14, and the load lock 34 between the substrate pass through chamber 14 and the substrate load chamber 12 is closed. The load lock 36 between the substrate transfer chamber 16 is then closed, and the load lock 34 is opened when the first environment of intermediate cleanliness has been formed within the substrate load chamber 12 and the load lock 32 is closed. The substrate is then transferred into the substrate load chamber 12, and the load lock 34 between the substrate pass through chamber 14 and the substrate load chamber 12 is closed. Finally, the load lock 32 is opened when the load lock 34 is closed, and the substrate is withdrawn from the apparatus 10 into the contaminant laden ambient environment.

Thus, by using the apparatus 10 according to the method as described above, all of the processes, materials, and structures that are preferably isolated from the contaminant laden ambient environment are so isolated, and the substrate is only exposed to the contaminant laden ambient environment at such points in the processing when such exposure is not unduly detrimental to the exposed materials and structures on the substrate.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of performing contaminant sensitive processing on a substrate, comprising the steps of:

transferring the substrate from an ambient contaminant laden environment through an open initial load lock and into a substrate load chamber, isolating the substrate from the ambient contaminant laden environment with the substrate load chamber by closing the initial load lock, forming a first environment of intermediate cleanliness around the substrate in the substrate load chamber, transferring the substrate from the intermediate cleanliness of the first environment of the substrate load chamber through an open first load lock and into a substrate pass through chamber, isolating the substrate from the intermediate cleanliness of the first environment of the substrate load chamber with the substrate pass through chamber by closing the first load lock, forming a second environment of high cleanliness around the substrate with the substrate pass through chamber, transferring the substrate from the high cleanliness of the second environment of the substrate pass through chamber through an open second load lock and into a substrate transfer chamber, isolating the substrate from the high cleanliness of the second environment of the substrate pass through chamber with the substrate transfer chamber by closing the second load lock, maintaining a third environment of high cleanliness around the substrate with the substrate transfer chamber, selectively transferring the substrate into more than one substrate processing chambers through at least one third load lock, where the substrate is selectively transferred into and out of the more than one substrate processing chambers without leaving the high cleanliness of the third environment, selectively processing the substrate in the more than one substrate processing chambers, transferring the substrate to the substrate pass through chamber from the substrate transfer chamber through the opened second load lock when the substrate pass through chamber has formed the high cleanliness of the second environment when the first load lock is closed and the substrate pass through chamber is not open to the substrate load chamber, transferring the substrate to the substrate load chamber from the substrate pass through chamber through the opened first load lock when the substrate load chamber has formed the intermediate cleanliness of the first environment when the initial load lock is closed and the second load lock is closed and the substrate pass through chamber is not open to the substrate transfer chamber, and transferring the substrate out of the substrate load chamber and into the ambient contaminant laden environment through the opened initial load lock when the first load lock is closed and the substrate load chamber is not open to the substrate pass through chamber.

2. The method of claim 1 wherein the step of processing the substrate in the more than one substrate processing chambers further comprises:

etching the substrate in an etch chamber, cleaning the substrate in a clean chamber, and depositing a layer in a deposition chamber.

3. The method of claim 1 wherein the step of processing the substrate in the more than one substrate processing chambers further comprises:

etching the substrate in an etch chamber, cleaning the substrate in a clean chamber, and depositing a layer of titanium in a deposition chamber.

4. The method of claim 1 wherein the step of processing the substrate in the more than one processing chambers further comprises:

etching the substrate in an etch chamber, cleaning the substrate in a clean chamber, depositing a layer of tantalum in a first deposition chamber, and depositing a layer of copper in a second deposition chamber.

5. The method of claim 1 wherein:

the step of forming the first environment of intermediate cleanliness in the substrate load chamber further comprises using a first pumping system, the step of forming the second environment of high cleanliness in the substrate pass through chamber further comprises using a second pumping system, and the step of forming the third environment of high cleanliness in the substrate transfer chamber further comprises using a third pumping system.

6. A method of forming a via on a substrate of a low dielectric constant material, comprising the steps of:

forming a first environment of intermediate cleanliness around the substrate with a substrate load chamber that receives the substrate from an ambient contaminant laden environment through an open initial load lock and isolates the substrate from the ambient contaminant laden environment by closing the initial load lock, forming a second environment of high cleanliness around the substrate with a substrate pass through chamber that receives the substrate from the substrate load chamber through an open first load lock and isolates the substrate from the intermediate cleanliness of the first environment of the substrate load chamber by closing the first load lock, maintaining a third environment of high cleanliness around the substrate with a substrate transfer chamber that receives the substrate from the substrate pass through chamber through an open second load lock and isolates the substrate from the high cleanliness of the second environment of the substrate pass through chamber by closing the second load lock, transferring the substrate into more than one substrate processing chambers through at least one third load lock, where the substrate is selectively transferred into and out of the more than one substrate processing chambers without leaving the high cleanliness of the third environment, etching the substrate in an etch chamber to form a via recess, depositing a titanium adhesion layer in a first deposition chamber, depositing a titanium nitride diffusion barrier layer in a second deposition chamber, selectively transferring the substrate to the substrate pass through chamber from the substrate transfer chamber through the opened second load lock when the substrate pass through chamber has formed the high cleanliness of the second environment when the first load lock is closed, selectively transferring the substrate to the substrate load chamber from the substrate pass through chamber through the opened first load lock at a time when the substrate load chamber has formed the intermediate cleanliness of the first environment when the initial load lock is closed and the second load lock is closed, and selectively transferring the substrate out of the substrate load chamber into the ambient contaminant laden environment through the opened initial load lock at a time when the first load lock is closed and the substrate load chamber is not open to the substrate pass through chamber.

* * * * *